US012660371B2

(12) United States Patent
Chaji et al.

(10) Patent No.: US 12,660,371 B2
(45) Date of Patent: Jun. 16, 2026

(54) PATTERNING TECHNIQUES FOR VERTICAL SOLID STATE DEVICES

(71) Applicant: VueReal Inc., Waterloo (CA)

(72) Inventors: Gholamreza Chaji, Waterloo (CA); Lauren Lesergent, Kitchener (CA); Ehsanollah Fathi, Waterloo (CA); Aaron Daniel Trent Wiersma, Kitchener (CA)

( * ) Notice: Subject to any disclaimer, the term of this patent is extended or adjusted under 35 U.S.C. 154(b) by 554 days.

(21) Appl. No.: 17/616,450

(22) PCT Filed: Jun. 5, 2020

(86) PCT No.: PCT/CA2020/050777
§ 371 (c)(1),
(2) Date: Dec. 3, 2021

(87) PCT Pub. No.: WO2020/243841
PCT Pub. Date: Dec. 10, 2020

(65) Prior Publication Data
US 2022/0271191 A1 Aug. 25, 2022

Related U.S. Application Data

(60) Provisional application No. 62/857,363, filed on Jun. 5, 2019.

(51) Int. Cl.
*H10H 20/01* (2025.01)
*H10H 20/815* (2025.01)
*H10H 29/14* (2025.01)

(52) U.S. Cl.
CPC .......... *H10H 20/01* (2025.01); *H10H 20/815* (2025.01); *H10H 29/142* (2025.01)

(58) Field of Classification Search
CPC ... H01L 33/0095; H01L 27/156; H01L 33/12; H01L 21/3081
See application file for complete search history.

(56) References Cited

U.S. PATENT DOCUMENTS

| | | | | |
|---|---|---|---|---|
| 5,130,770 A | * | 7/1992 | Blanc ................. | H10D 30/6733 |
| | | | | 257/E29.314 |
| 5,328,488 A | * | 7/1994 | Daikuzono ............ | A61B 18/22 |
| | | | | 606/17 |

(Continued)

FOREIGN PATENT DOCUMENTS

| | | |
|---|---|---|
| CN | 102160144 A | 8/2011 |
| CN | 103390584 A | 11/2013 |

(Continued)

OTHER PUBLICATIONS

WIPO: PCT International Search Report and Written Opinion relating to PCT application No. PCT/CA2020/050777, dated Aug. 31, 2020.

(Continued)

*Primary Examiner* — Mohammad A Rahman

(57) ABSTRACT

Devices and methods for patterning the vertical solid state devices are provided. In some examples, a method of fabricating micro devices comprising forming device layers on a substrate, forming a first masking layer on a top layer of the device layers, forming a second masking layer on the first masking layer; and etching the device layers using the first and second masking layers to pattern the device layers.

14 Claims, 3 Drawing Sheets

(56) References Cited

U.S. PATENT DOCUMENTS

| | | | | |
|---|---|---|---|---|
| 5,387,484 | A | 2/1995 | Doany et al. | |
| 5,851,856 | A * | 12/1998 | Nagura | H01L 21/76802 |
| | | | | 257/E27.105 |
| 6,320,568 | B1 * | 11/2001 | Zavracky | H10D 86/40 |
| | | | | 257/E29.295 |
| 10,297,510 | B1 * | 5/2019 | Seo | H01L 21/823431 |
| 10,361,129 | B1 * | 7/2019 | Sieg | H10D 84/016 |
| 2007/0048674 | A1 | 3/2007 | Wells | |
| 2010/0291476 | A1 | 11/2010 | Liu | |
| 2014/0335445 | A1 | 11/2014 | Kang | |
| 2016/0099174 | A1 * | 4/2016 | Wu | H01L 21/76877 |
| | | | | 438/618 |
| 2017/0186907 | A1 | 6/2017 | Chaji et al. | |
| 2018/0287027 | A1 | 10/2018 | Chaji | |
| 2018/0315857 | A1 * | 11/2018 | Li | H10D 64/017 |
| 2018/0346326 | A1 | 12/2018 | Fujii | |
| 2019/0033706 | A1 | 1/2019 | Yu et al. | |
| 2020/0350512 | A1 * | 11/2020 | Guo | H10K 59/873 |
| 2021/0020709 | A1 * | 1/2021 | Yang | H10K 59/60 |
| 2021/0098260 | A1 * | 4/2021 | Yoon | H01L 21/3081 |

FOREIGN PATENT DOCUMENTS

| | | |
|---|---|---|
| EP | 1387040 A1 | 2/2004 |
| WO | 2010132071 A1 | 11/2010 |

OTHER PUBLICATIONS

CNIPA: CN Office Action relating to CN application No. 202080040637.7, dated Feb. 24, 2025.
CN Office Action relating to CN application No. 202080040637.7, dated Nov. 6, 2025.
CN Office Action relating to CN application No. 202080040637.7, dated Jul. 29, 2025.

\* cited by examiner

PATTERNING TECHNIQUES FOR VERTICAL SOLID STATE DEVICES

BACKGROUND AND FIELD OF THE INVENTION

The present invention pertains to vertical solid state devices fabrication, and more particularly to improved patterning techniques for vertical solid state devices.

Light Emitting Diodes (LED) and LED arrays can be categorized as vertical solid state devices. The light emitting diodes may comprise organic micro devices, inorganic micro devices, sensors, or any other solid devices grown, deposited, or monolithically fabricated on a substrate. A plurality of device layers may be deposited on the substrate to fabricate micro devices. After deposition of all the layers, an etching process can be done using, for example, dry etching, wet etching, or laser ablation.

However, the etching process uses toxic gases and expensive process. To further reduce the cost and improve the process, patterning techniques with no toxic gases are needed. Furthermore, a patterning that is compatible with different materials and processing steps can greatly enhance the process optimization.

SUMMARY

An object of the present invention is to provide a patterning process comprising masking layers for a laser to pattern the epitaxial layers/device layers.

In one embodiment, a method of fabricating micro devices may be provided. The method may comprise forming device layers on a substrate, forming a first masking layer on a top layer of the device layers, forming a second masking layer on the first masking layer; and etching the device layers using the first and second masking layers to pattern the device layers.

In another embodiment, a vertical solid state device may be provided. The vertical solid state device may comprising a substrate, a plurality of device layers deposited on the substrate, a first masking layer formed on a top layer of the device layers; and a second masking layer formed on the first masking layer; wherein the device layers are etched using the first and second masking layers.

The foregoing and additional aspects and embodiments of the present disclosure will be apparent to those of ordinary skill in the art in view of the detailed description of various embodiments and/or aspects, which are made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

Use of the same reference numbers in different figures indicates similar or identical elements.

Figure 1A:
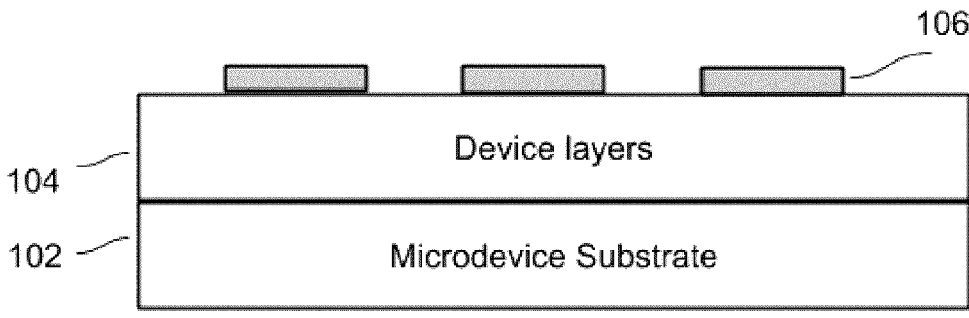
FIG. 1A illustrates a cross-sectional view of a vertical solid state substrate with device layers and a laser mask deposited thereon.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

As used in the specification and claims, the singular forms "a", "an" and "the" include plural references unless the context clearly dictates otherwise.

The term "comprising" as used herein will be understood to mean that the list following is non-exhaustive and may or may not include any other additional suitable items, for example, one or further feature(s), component(s) and/or element(s) as appropriate.

The terms "device" and "microdevice" and "optoelectronic device" are used herein interchangeably. It would be clear to one skill in the art that the embodiments described here are independent of the device size.

The terms "system substrate" and "receiver substrate" are used herein interchangeably. However, it is clear to one skill in the art that the embodiments described here are independent of substrate type.

The present disclosure provides a patterning process comprising masking layers for a laser to pattern the epitaxial layers/device layers.

In one embodiment, a masking layer such as a support mask may be provided on the device layers 104 that comprises a dielectric layer such as polyimide deposited over the device layers. This dielectric layer may act as an absorbing layer to prevent the laser affecting the covered area. Moreover, the support mask also protects the materials intended to stay from the laser shocks.

In another embodiment, another masking layer may be deposited on the support mask. The other masking layer may comprise Ni/Ti/Au/Ag act as a reflector mask to reflect the laser from the device area to protect the underlying device layers.

Various embodiments in accordance with the present structures and processes provided are described below in detail.

In general, LEDs are fabricated by depositing a stack of material on a substrate such as sapphire. FIG. 1A illustrates a cross-sectional view of a vertical solid state substrate with device layers and a masking layer 106 deposited thereon. Here, a GaN LED device which includes a substrate 102, such as sapphire and device layers 104 deposited on the substrate 102. The device layer 104 may include an active layer such as multiple quantum wells (MQW) layer and a p-type GaN layer. Other layers such as a transparent conductive layer such as Ni/Au or ITO are usually formed on the p-doped GaN layer for a better lateral current conduction. Further, p-type electrode such as a Pd/Au, Pt or a Ni/Au is then formed on the transparent conductive layer. After deposition of all the layers, an etching process can be done using, for example, dry etching, wet etching or laser ablation.

However, the etching processes such as dry etching or wet etching may use toxic gases and expensive processes. To further reduce the cost and improve the process, patterning techniques with no toxic gases are needed. Here, a laser is used to expose light to pattern the device layers.

In one embodiment, the masking layer 106 may be used to perform the etching process. In one case, the masking layer 106 may comprise a support mask. The support mask may be a dielectric layer such as polyimide deposited over the device layers. This dielectric layer may act as an absorbing layer to prevent the laser affecting the covered area and also protect the materials intended to stay from the laser shocks. Moreover, the support mask also protects the materials intended to stay from the laser shocks. In another case, the masking layer 106 may act as a reflector mask to reflect the laser from the device area to protect the underlying device layers.

Figure 1B:
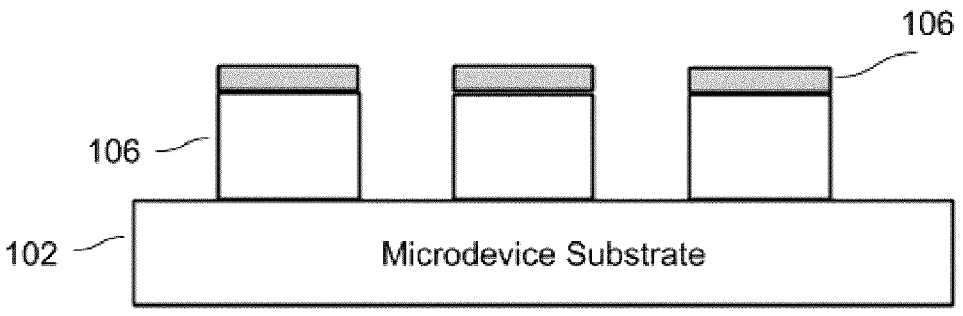
FIG. 1B illustrates a cross-sectional view of a vertical solid state substrate after patterning of the device layers and a laser mask deposited thereon.

FIG. 1B illustrates a cross-sectional view of a vertical solid state structure after patterning of the device layers and a masking layer deposited thereon. Here, in an alternative embodiment, firstly the device layers deposited on the substrate 102 may be patterned to form a micro device array structure 106 before depositing the other conductive or ohmic layers. A masking layer 106 may be used to perform the etching process. Annealing may be done after the etching to clear the edges. Edge passivation or edge treatment can be also done after the patterning.

Figure 2A:
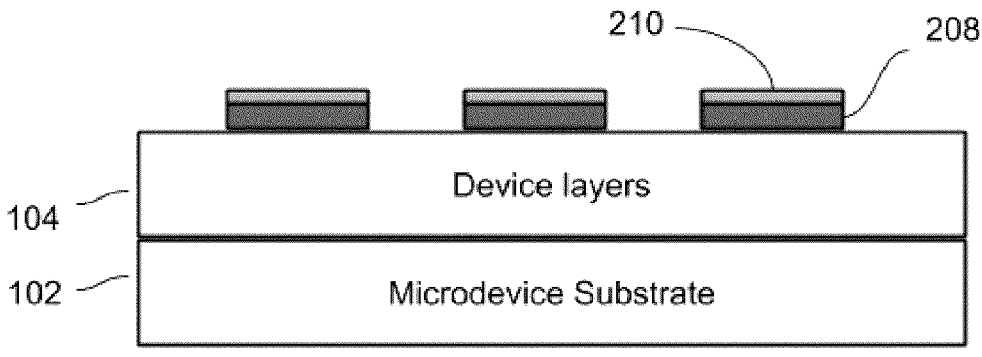
FIG. 2A illustrates a cross-sectional view of a vertical solid state substrate with device layers and masking layers deposited thereon.

FIG. 2A illustrates a cross-sectional view of a vertical solid substrate with device layers and masking layers deposited thereon.

Here, a microdevice substrate 102 may be provided. A plurality of device layers 104 may be formed on the microdevice substrate 102. A first masking layer such as support mask 208 may be provided on the device layers 104. The first masking layer/a support mask 208 may comprises a dielectric layer such as polyimide may be deposited over the device layers. This dielectric layer may act as an absorbing layer to prevent the laser affecting the covered area. Moreover, the support mask also protects the materials intended to stay from the laser shocks.

A second masking layer 210 may be deposited on the first masking layer 208. The second masking layer 210 may comprise Ni/Ti/Au/Ag. This second masking layer 210 may act as a reflector mask to reflect the laser from the device area to protect the underlying device layers 104. In this case, the first masking layer does not need to be an absorbing layer.

Figure 2B:
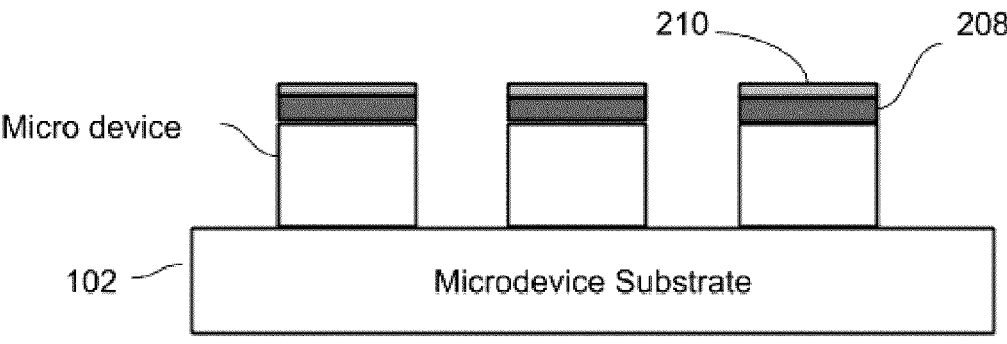
FIG. 2B illustrates a cross-sectional view of a vertical solid state substrate after patterning of the device layers and masking layers deposited thereon.

FIG. 2B highlights the cross-sectional view of the micro devices formed by the laser using the support or the reflector mask.

Here, after depositing the first masking layer 208 as a dielectric layer and second masking layer 210 on the device layers, etching may be performed to pattern the device layers. The masking layers 208, 210 can be removed after the etching (or after post processing the formed mesa structure/micro devices).

Figure 3A:
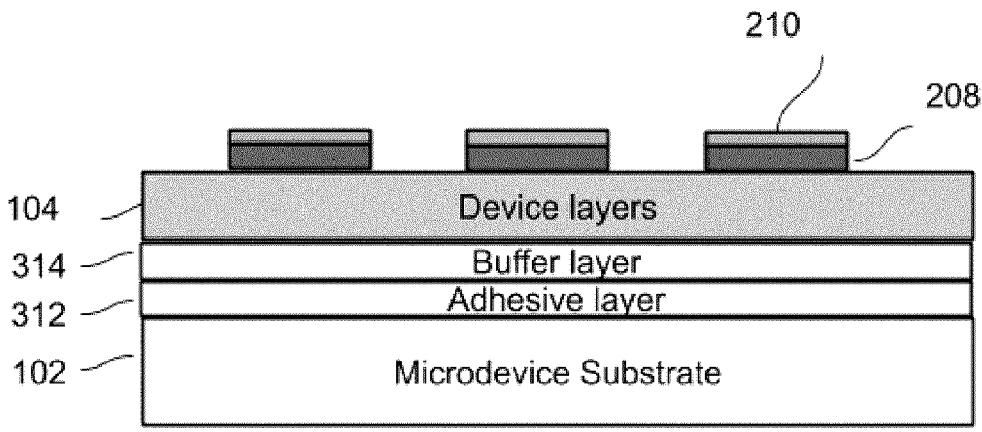
FIG. 3A illustrates a cross-sectional view of a vertical solid state substrate with device layers having adhesive layers and masking layers deposited thereon.

FIG. 3A illustrates a cross-sectional view of a vertical solid state substrate with device layers having adhesive layers and masking layers deposited thereon. In another case, the device layers may have been moved to a carrier substrate first. Here, the layers are bonded to the carrier substrate using an adhesive layer 312. A buffer layer may be used before or after the adhesive layer 314.

Figure 3B:
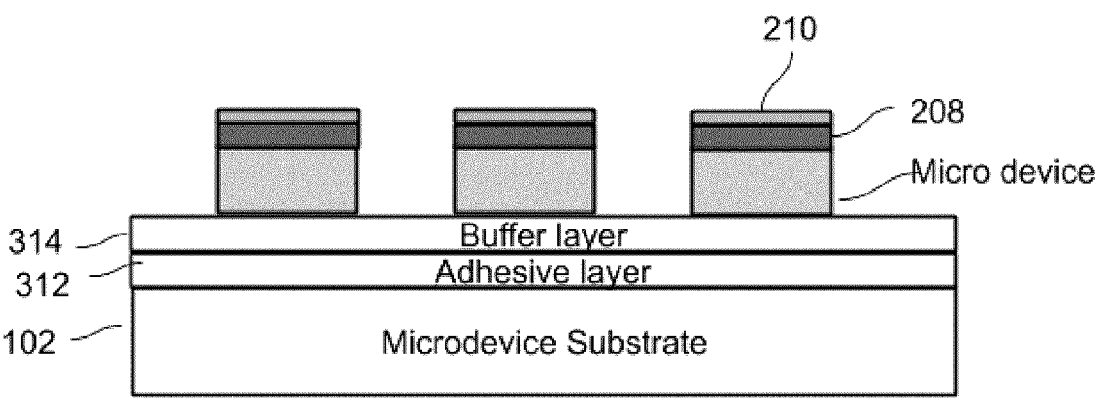
FIG. 3B illustrates a cross-sectional view of a vertical solid state substrate after patterning of the device layers and having adhesive layers and masking layers deposited thereon.

FIG. 3B illustrates a cross-sectional view of a vertical solid state substrate after patterning of the device layers and having adhesive layers and masking layers deposited thereon. Here, after depositing all the layers, etching may be performed to pattern the device layers. The masking layers 202, 204 can be removed after the etching (or after post processing the formed mesa structure/micro devices).

According to one embodiment, a method of fabricating micro devices may be provided. The method may comprise forming device layers on a substrate, forming a first masking layer on a top layer of the device layers, forming a second masking layer on the first masking layer; and etching the device layers using the first and second masking layers to pattern the device layers.

According to yet another embodiment, the method may further comprise removing the first masking layer and the second masking layer after etching.

According to some embodiments, a laser is used to expose light to pattern the device layers. The first masking layer comprises a dielectric layer acting as an absorbing layer to prevent the laser heating the device layers. The second masking layer comprises one of: nickel, titanium, gold or silver. The second masking layer acting as a reflective layer to reflect the laser light.

According to further embodiments, an annealing process may be done after etching to clear the edges of micro devices and an edge passivation process may be done after etching.

According to another embodiment, the method may further comprise an adhesive layer deposited on the substrate to bond the device layers to the substrate and a buffer layer deposited on the substrate before or after the adhesive layer.

In another embodiment, a vertical solid state device may be provided. The vertical solid state device may comprising a substrate, a plurality of device layers deposited on the substrate, a first masking layer formed on a top layer of the device layers; and a second masking layer formed on the first masking layer, wherein the device layers are etched using the first and second masking layers.

According to some embodiments, a vertical solid state device may be provided. The device may comprise a substrate, a plurality of device layers deposited on the substrate; a first masking layer formed on a top layer of the device layers; and a second masking layer formed on the first masking layer; wherein the device layers are etched using the first and second masking layers.

According to one embodiment, a laser may be used to expose light to pattern the device layers.

According to yet another embodiment, an adhesive layer deposited on the substrate to bond the device layers to the substrate and a buffer layer deposited on the substrate before or after the adhesive layer.

While the present disclosure is susceptible to various modifications and alternative forms, specific embodiments or implementations have been shown by way of example in the drawings and are described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

We claim:

1. A method of fabricating micro devices comprising:

forming device layers on a substrate, the device layers including a multiple quantum well (MQW) layer, a p-type GaN layer, a transparent conductive layer formed on the p-type GaN layer, and a p-type electrode formed on the transparent conductive layer;

forming a first masking layer on a top layer of the device layers;

forming a second masking layer on the first masking layer acting as a reflective layer; and etching the device layers using a laser, the first and second masking layers to pattern the device layers to form a micro device array structure, wherein the first and second masking layers protect the unetched device layers from the laser.

2. The method of claim 1, further comprising removing the first masking layer and the second masking layer after etching.

3. The method of claim 1, wherein the first masking layer comprises a dielectric layer acting as an absorbing layer to prevent the laser heating the device layers.

4. The method of claim 1, wherein the second masking layer comprises one of: nickel, titanium, gold, or silver.

5. The method of claim 1, wherein an annealing process is formed after etching to clear the edges of micro devices.

6. The method of claim 1, wherein an edge passivation process is formed after etching.

7. The method of claim 1, further comprising, an adhesive layer deposited on the substrate to bond the device layers to the substrate.

8. The method of claim 1, further comprising a buffer layer deposited on the substrate before or after the adhesive layer.

9. The method of claim 1, wherein the first masking layer comprises a polyimide deposited over the device layers.

10. The method of claim 1, wherein the p-type electrode formed on the transparent conductive layer is Pd/Au, Pt or Ni/Au.

11. A vertical solid state device comprising:

a substrate;

device layers deposited on the substrate, the device layers including a multiple quantum well (MQW) layer, a p-type GaN layer, a transparent conductive layer formed on the p-type GaN layer, and a p-type electrode formed on the transparent conductive layer;

a first masking layer formed on a top layer of the device layers; and a second masking layer formed on the first masking layer acting as a reflective layer, wherein the device layers are etched using a laser to pattern the device layers to form a micro device array structure, wherein the first and second masking layers protect the unetched device layers from the laser.

12. The vertical solid state device of claim 11, further comprising, an adhesive layer deposited on the substrate to bond the device layers to the substrate.

13. The vertical solid state device of claim 11, further comprising, a buffer layer deposited on the substrate before or after the adhesive layer.

14. The vertical solid state device of claim 11, wherein the p-type electrode formed on the transparent conductive layer is Pd/Au, Pt or Ni/Au.

* * * * *